United States Patent [19]
DeBusk

[11] Patent Number: 6,017,805
[45] Date of Patent: Jan. 25, 2000

[54] METHOD OF REDUCING MOBILE ION CONTAMINANTS IN SEMICONDUCTOR FILMS

[75] Inventor: Damon K. DeBusk, Orlando, Fla.

[73] Assignee: Lucent Technologies Inc., Murray Hill, N.J.

[21] Appl. No.: 09/013,486

[22] Filed: Jan. 26, 1998

[51] Int. Cl.$^7$ .................................................. H01L 21/30
[52] U.S. Cl. ............................................ 438/471; 438/476
[58] Field of Search ..................................... 438/471, 472, 438/473, 474, 475, 476, 477

[56] References Cited

U.S. PATENT DOCUMENTS

| | | | |
|---|---|---|---|
| 4,812,756 | 3/1989 | Curtis et al. | 324/158 |
| 5,646,053 | 7/1997 | Schepis et al. | |

OTHER PUBLICATIONS

Gregory S. Horner, Michael A. Peters; Corona Oxide Semiconductor Test; Semiconductor Test Supplement—Feb./Mar. 1995; pp. 1–2.

Tom G. Miller; A New Approach for Measuring Oxide Thickness; Semiconductor International Jul., 1995; pp. 1–2.

Gregory S. Horner, Meindert Kleefstra, Tom G. Miller, Michael A. Peters; Monitoring Electrically Active Contaminants to Assess Oxide Quality; Solid State Technology Jun. 1995; pp. 1–4.

John Bickley; Quantox™ Non–Contact Oxide Monitoring System; Keithley Instruments, Inc. 1995; pp. 1–6.

*Primary Examiner*—Charles Bowers
*Assistant Examiner*—Keith Christianson

[57] ABSTRACT

The present invention provides the broad concept of increasing product performance and reliability by causing the ion contaminants to migrate to a region of the semiconductor film and removing that region (containing a concentration of the ion contaminants), thus reducing a total concentration of the ion contaminants in the semiconductor film. Since a concentration of ion contaminants may adversely affect performance and reliability of devices manufactured from semiconductor films having the ion contaminants, the present invention removes the ion contaminants to alleviate performance and reliability problems associated with the presence of the ion contaminants.

18 Claims, 4 Drawing Sheets

METHOD OF REDUCING MOBILE ION CONTAMINANTS IN SEMICONDUCTOR FILMS

TECHNICAL FIELD OF THE INVENTION

The present invention is directed, in general, to a method for manufacturing semiconductor wafers and, more specifically, to a method for reducing a concentration of ion contaminants in a semiconductor film.

BACKGROUND OF THE INVENTION

Contamination is a continuing problem in the manufacture of semiconductor devices. Demands for higher product performance have resulted in device designs with narrower line-widths and thinner dielectric materials for faster operation and lower operating voltages. Consequently, the devices are more sensitive to defects and contaminants. Semiconductor manufacturers, therefore, must achieve tighter controls on contamination to meet the electrical performance levels that future generations of products will demand.

Contaminants can be any form of matter that causes unintentional changes in electrical properties of semiconductor devices. Some common contaminants include atomic, ionic, and molecular defects. These contaminants may affect devices by changing leakage, surface inversion, parametric shifts, or reliability characteristics. Electrically active mobile ion contaminants in semiconductor films, in particular, must be minimized since the embedded ion contaminants may attract or repel free charges in the underlying substrate. In most cases, device performance depends on a concentration of free charges in the substrate. The presence of a high level of ion contaminants in the semiconductor films, therefore, will usually introduce unwanted variations in device performance. Sodium ions, for instance, are particularly problematic. Sodium ions are practically invisible and may move unpredictably through the semiconductor film, causing the device to perform improperly or to fail prematurely.

To prevent contaminants from being introduced into the semiconductor films, a semiconductor manufacturer may monitor the level of contaminants in the manufacturing equipment using electrical tests (e.g., capacitance-voltage testing or triangular voltage sweep testing) or analytical tests (e.g., secondary ion mass spectrometry or vapor phase decomposition-inductively coupled plasma mass spectrometry) prior to device processing. Equipment exhibiting an unacceptably high level of contaminants must then be carefully cleaned. Some equipment, plasma etches, for instance, are highly susceptible to contamination. Plasma etching subjects a wafer in a chamber to a chemical plasma and uses a glow discharge to produce chemically reactive substances from a relatively inert molecular gas. The substances then react chemically to etch unprotected areas of the wafer. Etching, by its very nature, removes material from the wafer. Some of the material removed will inevitably deposit in the chamber to contaminate subsequent wafers. The material removed may also deposit on and thereby contaminate the wafer being etched. Careful cleaning of the chamber, therefore, may reduce the level of contaminants in subsequent wafers but may not reduce the level of contaminants in the wafer being etched.

Alternatively, a sensitivity of the device to contamination may be reduced through the use of gettering schemes, such as HCl introduction during thermal oxidation growth, or phosphorous backside gettering. Backside gettering methods such as phosphorous diffusion may trap some contaminants on the backside of the wafer. A disadvantage of phosphorous diffusion, however, is that large amounts of phosphorous on the wafer backside can cause problems in later process steps by contaminating or auto-doping epitaxial layers on the active side of the wafer.

Of course, electrical tests such as capacitance-voltage testing and triangular voltage sweep testing, may be also used after processing to screen out contaminated devices. While reliability may be improved by simply screening out devices having a high level of contaminants, this approach does not actually decrease the level of contaminants in the devices.

Accordingly, what is needed in the art is a method for reducing a level of contaminants from the semiconductor film, thereby increasing product performance and reliability.

SUMMARY OF THE INVENTION

To address the above-discussed deficiencies of the prior art, the present invention provides a method of reducing ion contaminants in a semiconductor film. In one particularly advantageous embodiment, the method comprises the steps of moving the ion contaminants to a region near a surface of the semiconductor film and removing the region to reduce a concentration of the ion contaminants in the semiconductor film.

The present invention, therefore, introduces the broad concept of increasing product performance and reliability by causing the ion contaminants to migrate to a region of the semiconductor film and removing that region (containing a concentration of the ion contaminants), thus reducing a total concentration of the ion contaminants in the semiconductor film. Region as used herein is defined to be that portion of the semiconductor film that is intended to be removed by the step of removing. Ion contaminants as used herein is defined to be any mobile ions, sodium, for instance, that exist in a semiconductor film. Since a concentration of ion contaminants may adversely affect performance and reliability of devices manufactured from semiconductor films having the ion contaminants, the present invention removes the ion contaminants to alleviate performance and reliability problems associated with the presence of the ion contaminants.

In one embodiment of the present invention, the step of moving includes depositing a charge on the surface where the charge is opposite to a charge of the ion contaminants.

The step of moving, in one embodiment, includes heating the semiconductor film. In a related embodiment, wherein the ion contaminants are sodium ions, the step of heating includes heating the semiconductor film to a temperature ranging from about 168° C. to about 175° C. In another aspect of this particular embodiment, the step of heating includes heating the semiconductor film for a period of time ranging from about 1 minute to about 6 minutes. Of course, other ion contaminants may require higher or lower heating temperatures or heating periods.

In another embodiment of the present invention, the ion contaminants are positively charged and the step of moving includes depositing a negative charge on the semiconductor film. In one related embodiment, the voltage of the negative charge is a function of a thickness of the semiconductor film. In another related embodiment, the voltage of the negative charge is a function of the concentration of the ion contaminants in the semiconductor film. Of course, different ion contaminants may require the use of negative charges having higher or lower voltages, resulting in higher or lower electric fields.

In yet another embodiment of the present invention, the semiconductor film is a dielectric. In a preferred embodiment, however, the semiconductor film may be silicon-oxide.

In another embodiment, the step of removing includes the step of subjecting the semiconductor film to a fluid mixture. In such embodiments, the fluid mixture may be selected from the group consisting of an aqueous mixture, a gaseous mixture, and a plasma mixture.

In yet another embodiment, the step of removing includes the step of subjecting the semiconductor film to a mixture of deionized water and hydrogen flouride.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
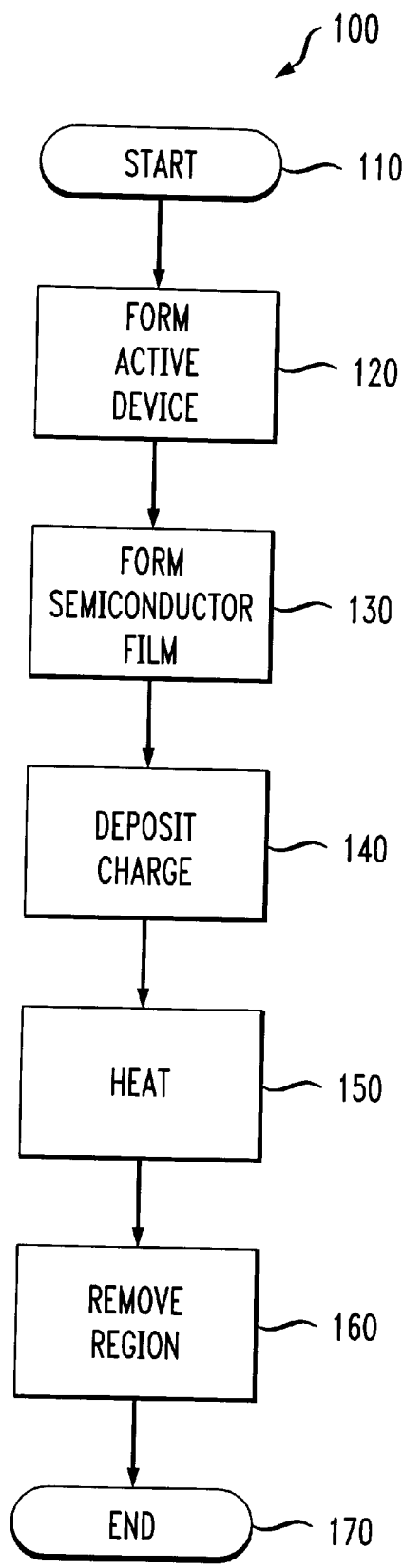
FIG. 1 illustrates a flowchart of an embodiment of a method of manufacturing a semiconductor wafer using the principles of the present invention.

Referring initially to FIG. 1, illustrated is a flowchart of an embodiment of a method 100 of manufacturing a semiconductor wafer using the principles of the present invention. The method begins at a start step 110. At a first formation step 120, active devices are formed on a surface of the semiconductor wafer. The active devices may be formed by conventional methods, including deposition and etch. Typically, device layers are deposited and patterned by photoresist. Unexposed parts of the photoresist and the underlying device layer are then removed either by plasma etching or by wet etching with specially engineered solvents. While the embodiment illustrated herein contains an active device, those skilled in the art will understand that the principles of the present invention are equally applicable to the manufacture of semiconductor wafers containing a passive device. Of course, the first formation step 120 is not an integral part of the present invention and may not be included in other embodiments of the present invention.

Then, at a second formation step 130, a semiconductor film is formed over the active devices by conventional methods. In one embodiment of the present invention, the semiconductor film is a dielectric layer. In an advantageous embodiment, the semiconductor film is an oxide layer, such as silicon-oxide. Of course, the deposition of other types of semiconductor films is well within the broad scope of the present invention.

Conventional methods of forming devices on the semiconductor wafer typically include a resist stripping process. During resist stripping, device layers are particularly vulnerable to contamination by trace metals, such as sodium, typically present in the stripper solvents. Additionally, methods of cleaning the semiconductor wafer may require the use of solvents containing alkali or alkali-earth ions (e.g., sodium Na+, potassium K+ and calcium Ca2+), which may contaminate the semiconductor film. Plasma metal etching equipment may present yet another source of contamination. During etching, photoresist attacked by the plasma may be deposited on components inside the plasma chamber, causing a build up of contaminants. A combination of electric fields and heat present during plasma etching may then drive some of the contaminants into the semiconductor film as redeposition (sublimation) occurs. Since contaminants may result in a degradation of device performance, a concentration of ion contaminants in the semiconductor film must be reduced. The method 100, therefore, moves the ion contaminants to a region near the surface of the semiconductor film.

In one embodiment of the method 100, the ion contaminants are moved by a charge deposition step 140 or a heating step 150. In an advantageous embodiment, the charge deposition step 140 consists of a deposition layer of corona charge on the surface of the semiconductor film. The layer of corona charge may be deposited by conventional methods such as scanning the semiconductor wafer back and forth under a corona charging filament. Those skilled in the art will realize that the use of a number of scans may increase an electric field strength of the corona charge. Of course, the use of other conventional methods to deposit the charge is well within the scope of the present invention. In another embodiment, the charge deposited is opposite to a charge of the ion contaminants. In a related embodiment, wherein positively charged ions are to be removed, the corona charge is of negative polarity. The negative corona charge may thus attract the positively charged ions to the surface of the semiconductor film.

In one embodiment of the method 100, wherein the ion contaminants are sodium ions, the heating step 150 includes heating the semiconductor film to a temperature ranging from 160° C. to 180° C. Alternatively, the heating step 150 includes heating the semiconductor film to a temperature ranging from about 168° C. to about 175° C. Of course, the use of other temperature ranges for heating semiconductor films containing other ion contaminants is still well within the broad scope of the present invention. The time for heating the semiconductor film may vary. In a particularly advantageous embodiment, wherein the ion contaminants are sodium ions, the heating step 150 includes heating the semiconductor film for up to ten minutes. Alternatively, the heating step 150 includes heating the semiconductor film for a period of time ranging from about 1 minute to about 6 minutes. Of course, the use of longer or shorter heating periods for other ion contaminants is well within the broad scope of the present invention. In a particularly advantageous embodiment, the charge deposition step 140 and the heating step 150 cooperate to move the ion contaminants to the region near the surface of the semiconductor wafer. Of course, the invention does not require both the charge deposition step 140 and the heating step 150.

Next, at a removal step 160, the region is removed, thereby reducing the concentration of ion contaminants in the semiconductor film. The region may be removed by conventional methods such as etching, wherein the semiconductor film is subjected to a fluid mixture. Those skilled in the art are familiar with etching methods using fluid mixtures including, aqueous, gaseous, or plasma mixtures. In an advantageous embodiment, however, the semiconductor film is subjected to a mixture of deionized water and hydrogen flouride to remove the region. In a more specific embodiment, the mixture consists of 100 parts deionized water to one part hydrogen flouride. Of course, the use of other conventional methods to remove the region is well within the scope of the present invention. The method 100 ends at an end step 170. The method herein illustrated and described performs the charge deposition step 140, the heating step 150, and the removal step 160 only once. Those skilled in the art will realize, however, that the charge deposition step 140, the heating step 150, and the removal step 160 may be repeated multiple times or as necessary to reduce a concentration of ion contaminants in the semiconductor film.

Figure 2A:
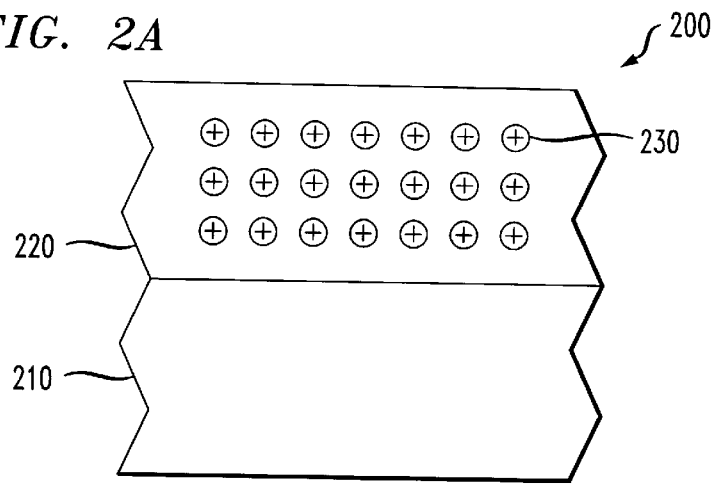
FIGS. 2A through 2C illustrate exemplary, cross-sectional partial views of a semiconductor wafer, which are not drawn to scale, used in constructing a semiconductor device according to the principles of the present invention.
Figure 2B:
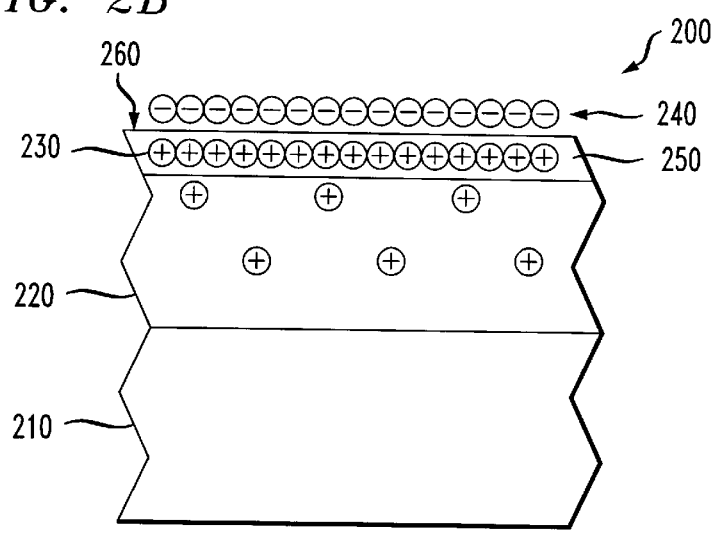
Figure 2C:
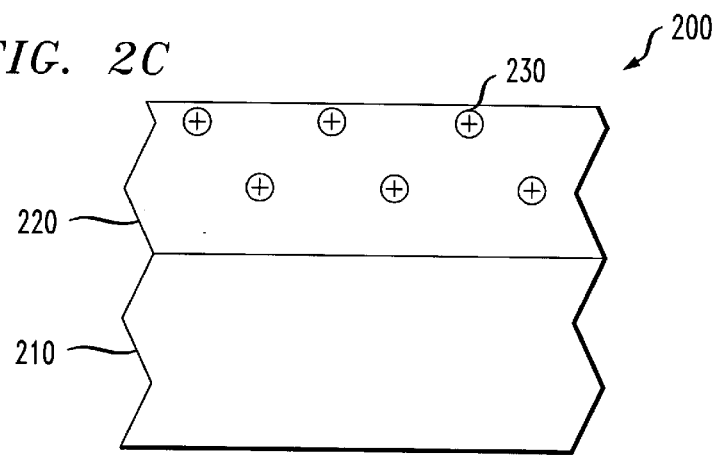

Turning now to FIGS. 2A through 2C, illustrated are exemplary, cross-sectional partial views of a semiconductor wafer 200, which are not drawn to scale, used in constructing a semiconductor device according to the principles of the present invention. Referring particularly to FIG. 2A, the semiconductor wafer 200 consists of a substrate 210 on which active devices (not shown) are formed. The semiconductor wafer 200 further contains a semiconductor film 220 or dielectric layer, containing ion contaminants 230. In the illustrated embodiment, the semiconductor film 220 is an oxide layer. Of course, the semiconductor film 220 may be formed from any conventional dielectric material. Additionally, those skilled in the art will realize that while the embodiment herein illustrated and described contains positively charged ion contaminants 230, the present invention is also applicable to semiconductor films having negatively charged ion contaminants.

Referring now to FIG. 2B, and with continuing reference to FIG. 1, a corona charge 240 is deposited over the semiconductor film 220 by the charge deposition step 140. In the illustrated embodiment, the corona charge 240 is a negative charge. Those skilled in the art will realize, of course, that positive corona charges should be used with negatively charged ion contaminants. The semiconductor wafer 200 is then heated by the heating step 150. In an advantageous embodiment, the semiconductor wafer 200 is heated to a temperature ranging from about 168° C. to about 175° C. for a period of time ranging from about 1 minute to about 6 minutes. The corona charge 240 or the heat thus cause the ion contaminants 230 to move to a region 250 near a surface 260 of the semiconductor film 220.

Referring now to FIG. 2C, and with continuing reference to FIGS. 1 and 2B, illustrated is the semiconductor wafer 200 after the removal step 160. As illustrated, the semiconductor film 220 contains a reduced concentration of ion contaminants, thereby enhancing performance and reliability characteristics of devices produced from the semiconductor wafer 200. In an advantageous embodiment, the region 250 is removed by subjecting the semiconductor film 220 to a mixture of deionized water and hydrogen flouride. Of course, the region may also be removed by other conventional methods, including aqueous, gaseous, and plasma etching methods.

Figure 3:
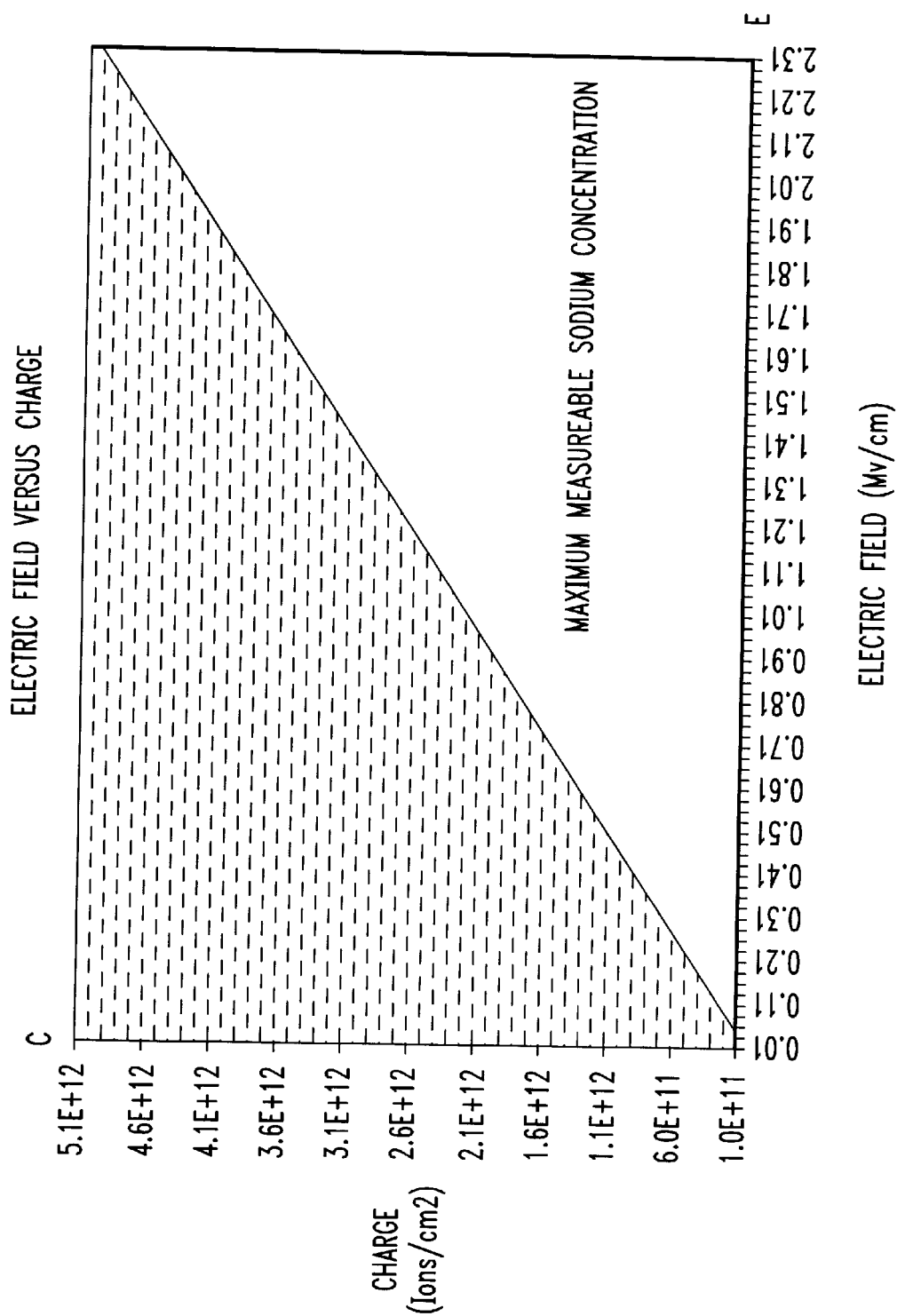
FIG. 3 illustrates a graph of an example of a relationship between an electric field and a concentration of sodium ions that may be moved by the electric field.

Turning now to FIG. 3, illustrated is a graph of an example of a relationship between an electric field E and a concentration of sodium ions (represented by a charge C) that may be moved by the electric field E. For example, an electric field E of about 0.5 Mv/cm may move, at most, about 1.1E+12 ions/cm$^2$ of sodium. Those skilled in the art will realize that, for other ion contaminants, the relationship between the electric field E and the charge C may vary from that illustrated and described herein.

Figure 4:
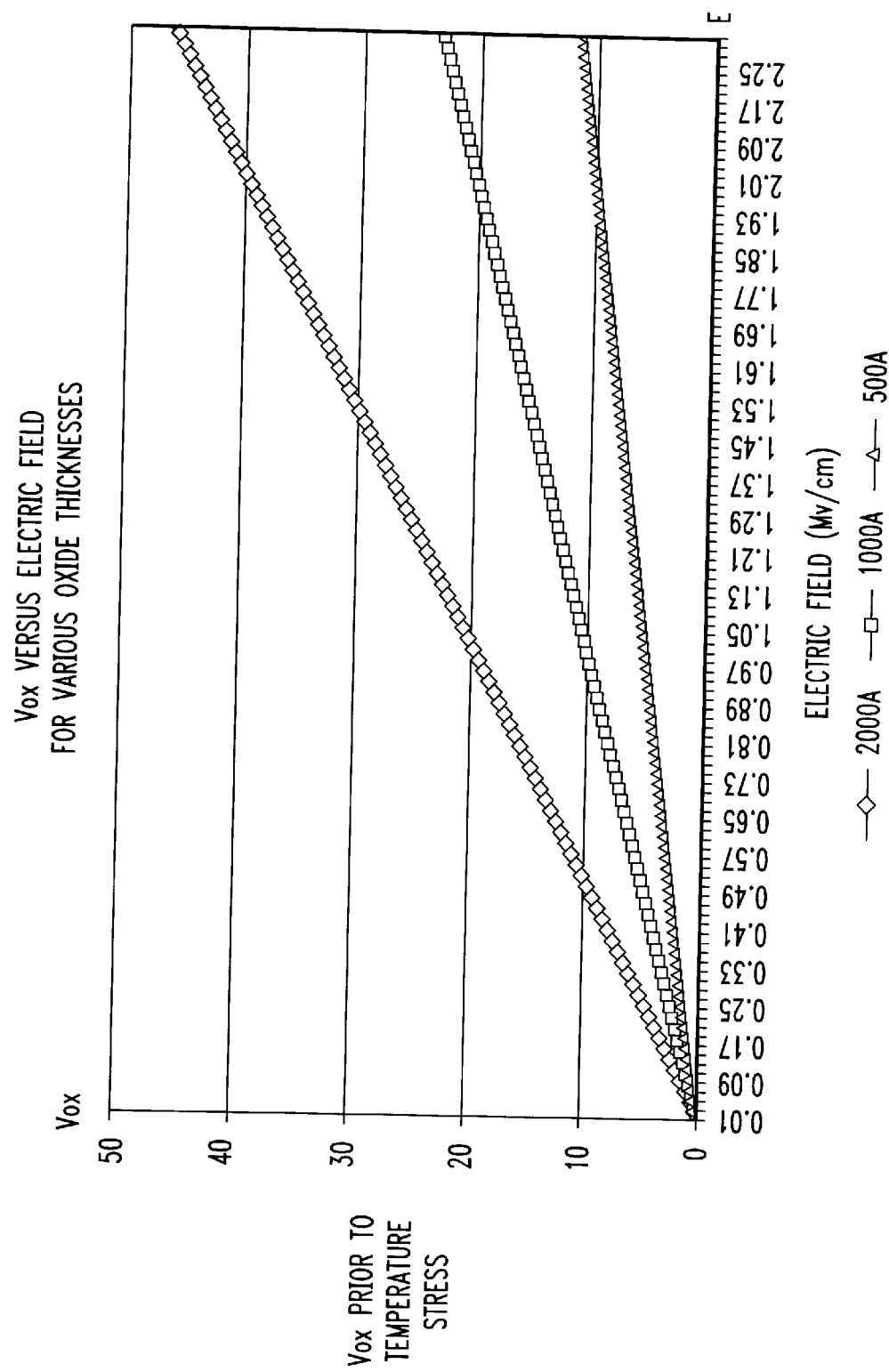
FIG. 4 illustrates a graph of an example of a relationship between an oxide voltage and an electric field for various thicknesses of silicon-oxide.

Turning now to FIG. 4, illustrated is a graph of an example of a relationship between an oxide voltage Vox and an electric field E for various thicknesses of silicon-oxide. The oxide voltage Vox and resulting electric field E shown are necessary to move a quantity of ion contaminants in an oxide of a given thickness. For example, approximately 20 volts may be required to create a field strength of approximately 1 Mv/cm in a oxide having a thickness of approximately 2000 Å. For a 1000 Å oxide, however, only about 10 volts is required to create a field of approximately the same strength. Those skilled in the art will realize, of course, that the relationship between the oxide voltage Vox and the electric field E is not necessarily as illustrated and, therefore, may vary depending on other parameters, such as a type or level of ion contaminants present in the semiconductor film, and a time or temperature for which the semiconductor film is heated.

Those skilled in the art should understand that the previously described embodiments of the method for reducing ion contaminants in a semiconductor film are submitted for illustrative purposes only and other embodiments capable of reducing a concentration of the ion contaminants by causing the ion contaminants to move to a region of the semiconductor film and removing that region, thereby reducing a total concentration of the ion contaminants in the semiconductor film are well within the broad scope of the present invention. For a better understanding of semiconductor manufacturing, see *Silicon Processing for the VLSI Era*, Volumes 1–3, by S. Wolf and R. N. Tauber, Lattice Press (1986), incorporated herein by reference.

From the foregoing, it is readily apparent that the present invention introduces the broad concept of increasing product performance and reliability by causing the ion contaminants to migrate to a region of the semiconductor film and removing that region (containing a concentration of the ion contaminants), thus reducing a total concentration of the ion contaminants in the semiconductor film. Since a concentration of ion contaminants may adversely affect performance and reliability of devices manufactured from semiconductor films having the ion contaminants, the present invention removes the ion contaminants to alleviate performance and reliability problems associated with the presence of the ion contaminants.

Although the present invention has been described in detail, those skilled in the art should understand that they can make various changes, substitutions and alterations herein without departing from the spirit and scope of the invention in its broadest form.

What is claimed is:

1. A method of reducing ion contaminants in a semiconductor film, comprising the steps of:

moving said ion contaminants to a region near a surface of said semiconductor film by depositing a charge on said surface, said charge being opposite to a charge of said ion contaminants; and removing said region to reduce a concentration of said ion contaminants in said semiconductor film.

2. The method as recited in claim 1 further comprising the step of heating said semiconductor film.

3. The method as recited in claim 2 wherein said ion contaminants are sodium ions and said step of heating includes heating said semiconductor film to a temperature ranging from about 168° C. to about 175° C.

4. The method as recited in claim 2 wherein said ion contaminants are sodium ions and said step of heating includes heating said semiconductor film for a period of time ranging from about 1 minute to about 6 minutes.

5. The method as recited in claim 1 wherein said ion contaminants are positively charged and said step of moving includes depositing a negative charge on said semiconductor film, a voltage of said negative charge being a function of a thickness of said semiconductor film.

6. The method as recited in claim 1 wherein said semiconductor film is a dielectric.

7. The method as recited in claim 1 wherein said step of removing includes the step of subjecting said semiconductor film to a fluid mixture.

8. The method as recited in claim 7 wherein said fluid mixture is selected from the group consisting of an aqueous mixture, a gaseous mixture, and a plasma mixture.

9. The method as recited in claim 1 wherein said step of removing includes the step of subjecting said semiconductor film to a mixture of deionized water and hydrogen flouride.

10. A method of manufacturing a semiconductor wafer having integrated circuits formed thereon, comprising the steps of:

forming active devices on a surface of said semiconductor wafer;

forming a dielectric layer over said active devices; and reducing ion contaminants in said dielectric layer, including the steps of:

moving said ion contaminants to a region near a surface of said dielectric layer by depositing a charge on said surface, said charge being opposite to a charge of said ion contaminants; and removing said region to reduce a concentration of said ion contaminants in said dielectric layer.

11. The method as recited in claim 10 further comprising the step of heating said dielectric layer.

12. The method as recited in claim 11 wherein said ion contaminants are sodium ions and said step of heating includes heating said dielectric layer to a temperature ranging from about 168° C. to about 175° C.

13. The method as recited in claim 11 wherein said ion contaminants are sodium ions and said step of heating includes heating said dielectric layer for a period of time ranging from about 1 minute to about 6 minutes.

14. The method as recited in claim 10 wherein said ion contaminants are positively charged and said step of moving includes depositing a negative charge on said dielectric layer, a voltage of said negative charge being a function of a thickness of said dielectric layer.

15. The method as recited in claim 10 wherein said dielectric layer is silicon-oxide.

16. The method as recited in claim 10 wherein said step of removing includes the step of subjecting said semiconductor film to a fluid mixture.

17. The method as recited in claim 16 wherein said fluid mixture is selected from the group consisting of an aqueous mixture a gaseous mixture and a plasma mixture.

18. The method as recited in claim 10 wherein said step of removing includes the step of subjecting said dielectric layer to a mixture of deionized water and hydrogen flouride.

* * * * *